(12) United States Patent  
Oster

(10) Patent No.: US 6,937,127 B2  
(45) Date of Patent: Aug. 30, 2005

(54) APPARATUS FOR MANIPULATING MAGNETIC FIELDS

(75) Inventor: Eugene L. Oster, Los Gatos, CA (US)

(73) Assignee: Oster Magnetics, Inc., San Jose, CA (US)

( * ) Notice: Subject to any disclaimer, the term of this patent is extended or adjusted under 35 U.S.C. 154(b) by 71 days.

(21) Appl. No.: 10/474,668

(22) PCT Filed: Sep. 9, 2003

(86) PCT No.: PCT/US03/28342

§ 371 (c)(1),  
(2), (4) Date: Oct. 14, 2003

(87) PCT Pub. No.: WO2004/022238

PCT Pub. Date: Mar. 18, 2004

(65) Prior Publication Data

US 2004/0233027 A1 Nov. 25, 2004

Related U.S. Application Data

(60) Provisional application No. 60/409,323, filed on Sep. 9, 2002, and provisional application No. 60/486,676, filed on Jul. 11, 2003.

(51) Int. Cl.[7] .......................... C23C 14/00; C25B 11/00; H01F 1/00; H01F 5/00
(52) U.S. Cl. ....................... 335/296; 335/297; 335/306; 204/298.16; 204/298.37
(58) Field of Search ................................. 335/210–214, 335/296–306; 156/345.42, 345.46, 345.49; 204/298.16–298.22, 298.37

(56) References Cited

U.S. PATENT DOCUMENTS

| | | | |
|---|---|---|---|
| 4,668,365 A | 5/1987 | Foster et al. | |
| 5,089,442 A | 2/1992 | Olmer | |
| 5,527,394 A | 6/1996 | Heinrich et al. | |
| 5,718,795 A | 2/1998 | Plavidal et al. | |
| 6,015,476 A | 1/2000 | Schlueter et al. | |
| 6,545,580 B2 * | 4/2003 | Hegde et al. | 335/296 |

* cited by examiner

*Primary Examiner*—Ramon M. Barrera  
(74) *Attorney, Agent, or Firm*—Gordon E. Nelson

(57) ABSTRACT

Techniques for producing and manipulating magnetic fields. The techniques employ the mutual repulsion of magnetic fields to create uniform magnetic fields and to manipulate the uniform magnetic fields. The uniform magnetic field is created between two planar magnets. The planar magnets have cores which describe a closed curve. Like poles of the electromagnets are connected by the cores. When the electromagnets are activated, repulsion between the magnetic fields generated by the electromagnets creates a magnetic field which extends above and below the planes of the planar magnets. If the planar magnets are positioned parallel to each other and aligned so that the magnetic fields generated by the planar magnets repel each other in the space between the planar magnets, the repulsion between the fields generates a resultant field. When the distance between the planar magnets is approximately ½ the diameter of the closed curve, the resultant field is uniform over a considerable volume of the space between the planar magnets. The uniform field may be manipulated by varying the magnitude and direction of the current provided to the electromagnets. Depending on the number and positions of the electromagnets and how power is supplied to them, the uniform field may be rotated, tilted in the horizontal and/or vertical planes, warped in the horizontal and/or vertical planes, and given gradients in the horizontal and/or vertical planes. The planar magnets may be fitted around the chambers of reactors such as those used for MERIE and the uniform field may be used to manipulate the plasma in the reactor chamber.

18 Claims, 15 Drawing Sheets

APPARATUS FOR MANIPULATING MAGNETIC FIELDS

CROSS REFERENCES TO RELATED APPLICATIONS

The present patent application claims priority from U.S. provisional patent application 60/409,323, Eugene L. Oster, "Any Angle" uniform field etch plasma magnet array, filed Sep. 9, 2002 and from U.S. provisional patent application 60/486,676, Eugene L. Oster, Improved "any angle" uniform field etch plasma magnet array, filed Jul. 11, 2003, and incorporates U.S. Pat. No. 6,015,476, Schlueter, et al., Plasma reactor magnet with independently-controllable parallel axial current-carrying elements, issued Jan. 18, 2000, by reference for all purposes.

BACKGROUND OF THE INVENTION

1. Field of the Invention

The invention relates to electromagnets generally and more specifically to electromagnets used to manipulate magnetic fields in enclosed vessels.

2. Description of Related Art

Magnetic fields have long been used to manipulate particles that respond to them such as charged particles or polar particles. In one large class of such uses, electromagnets located outside a vacuum vessel or reactor vessel are used to affect the behavior of particles that respond to the magnetic fields within the vessel. Examples of such uses are focusing electromagnets in cathode ray tubes or particle accelerators and electromagnets used to manipulate plasmas in plasma reactors or to control crystal growing processes.

An exemplary use of electromagnets to manipulate plasmas is magnetic enhanced reactive ion etching, or MERIE. Part of the process of producing an integrated circuit is etching the substrate for the circuit. A common way of doing this is by reactive ion etching, in which reactive ions do the etching. The parts of the substrate which are not to be etched are covered by a mask which is resistant to the reactive ions and the masked substrate is placed in a vessel in which a plasma of reactive ions is formed from a reactive gas. The reactive ions react with the unmasked areas of the substrate and the reaction etches the substrate. In MERIE, a magnetic field is used to manipulate the plasma to keep the plasma within the area over the substrate and increase the plasma's density, which increases the rate of etching. For details on MERIE and the reactors generally used in MERIE, see the Schlueter patent cited above.

One approach to manipulating the plasma in a MERIE reactor is simply to generate a constant uniform magnetic field in the vessel that keeps the plasma where it is wanted. One way of doing this employs the principles of the Helmholtz coil. A Helmholtz coil consists of two plane circular coils of radius r whose planes are parallel to each other. The centers of the coils are on a line perpendicular to the planes and the planes are r apart. In the area between the coils, the combined fields of the coils produce a generally constant magnetic field. An example of the use of the principles of the Helmholtz coil in a chemical vapor deposition reactor may be found in U.S. Pat. No. 4,668,365, Foster et al., Apparatus and method for magnetron-enhanced plasma-assisted chemical vapor deposition, issued May 26, 1987, in which a pair of electromagnetic coils having the geometry of the Helmholtz coil are used to provide a uniform magnetic field in which material is deposited on a substrate that is perpendicular to the planes of the Helmholtz coil. An example of the use of pairs of electromagnetic coils having the geometry of the Helmholtz coil to confine the plasma in a reactor vessel to the area between the electrodes of the vessel may be found in U.S. Pat. No. 5,527,394, Heinrich, et al., Apparatus for plasma enhanced processing of substrates, issued Jun. 18, 1996.

Another way of producing a more uniform magnetic field is described in U.S. Pat. No. 5,718,795, Plavidal, et al., Radial magnetic field enhancement for plasma processing, issued Feb. 17, 1998. Here, the magnet which produces the field is located above the ceiling of the vessel. The magnet has a ferrous yoke which has a hub connected by spokes to an outer ring. The hub, spokes, and ring form a shallow cone. The spokes have windings which are connected to an AC, DC, or RF power supply. The angle of the spokes is chosen to produce a relatively uniform radially symmetrical magnetic field at the level of the substrate.

A way of dealing with non-uniform plasmas is to use the electromagnets not only to keep the plasma where it is wanted, but to move the plasma. The most common arrangement for doing this is described in the Background Art portion of the Schlueter patent. Four electromagnetic coils are mounted 90° from each other on the sides of the vessel. The coils have vertical legs and horizontal legs, with the horizontal legs sometimes being bent to conform to the curve of the sides of the vessel. While the magnetic field produced by an opposed pair of the electromagnetic coils is not particularly uniform, the field can be rotated by varying the amount and direction of current in pairs of opposite coils. Rotation may be achieved by switching the current in the coils or more smoothly by applying AC currents to the coils in the amounts, phases and frequencies required to rotate the magnetic field. Slowly rotating the plasma in this fashion reduces the exposure of the circuitry in the substrate to irregularities in the plasma which can damage the circuitry.

Though the electromagnetic coils on the sides of the vessel permit rotation of the magnetic field, the lack of uniformity of the magnetic field both causes irregularities in the plasma and these in turn may lead to damage in the substrate. One way of producing a more uniform rotating magnetic field is described in the Schlueter patent; there, the magnetic field is generated by a number of coils wound on a ferrous cylinder that surrounds the outside of the vessel that contains the substrate at the position of the substrate. On the inside of the ferrous cylinder, the windings are parallel to the vertical axis of the vessel. The main function of the ferrous cylinder is to shield the windings on the inside of the ferrous cylinder from the windings on the outside of the cylinder. The windings on the inside of the ferrous cylinder generate a magnetic field in the area of the substrate. The field can be varied by varying the amounts of current provided to the different coils and the field can be rotated by varying the amounts and directions of the current in the coils according to a periodic pattern.

None of the foregoing techniques for producing magnetic fields inside a reactor vessel provides a perfect solution for MERIE. Ideally, it should be possible not only to produce a uniform magnetic field but also to produce a magnetic field with controlled gradations across the plane of the substrate and/or along the vertical axis of the vessel, and it should be possible to rotate or otherwise move whatever field is produced. It is further desirable to be able to retrofit current reactors employing coils on the sides of the vessels to produce rotating magnetic fields with electromagnets that are capable of producing highly-uniform rotating magnetic fields without affecting the retrofitted reactor's power supplies or arrangements for inserting and removing substrates or providing gaseous inputs.

It is thus an object of the invention disclosed herein to provide electromagnets which are capable of producing uniform magnetic fields, magnetic fields with controlled gradations in either the horizontal or vertical directions, and magnetic fields which can be rotated and moved and which can further be retrofitted to existing reactor vessels that employ coils on the sides of the vessels.

SUMMARY OF THE INVENTION

The object of the invention is achieved by apparatus for producing a magnetic field that includes two sets of magnetic elements. Each set defines a separate surface and produces a separate magnetic field by repulsion between the magnetic elements in the set. The set's magnetic field extends above and/or below the surface. The sets of magnetic elements are positioned relative to each other such that the surfaces are approximately parallel and the magnetic field produced by the apparatus is formed between the surfaces by repulsive interaction of the sets' magnetic fields. One or more of the magnetic elements may be an electromagnetic element and the magnetic field produced by the apparatus may be manipulated by changing the direction and/or magnitude of the current in selected ones of the electromagnetic elements. If each set includes two pairs of electromagnetic elements, the magnetic field may be manipulated to impart a rotary motion to the magnetic field.

In a particularly useful version of the apparatus, the magnetic elements comprise a pair of magnetic elements, the like poles of the elements in the pair being connected by a core and the first and second sets of magnetic elements being positioned relative to each other such that a portion of the magnetic field produced by the apparatus is uniform. More particularly, the magnetic elements in the pair are separated in the surface by a distance D and the surfaces are separated by a distance D/2. If each set contains two pairs of electromagnetic elements whose like poles are connected by the core, a rotary motion may be imparted to the uniform field by changing the direction and/or magnitude of the current in the pairs of electromagnetic elements. The uniform field may also be manipulated in other ways by changing the direction and/or magnitude of the current in the electromagnetic elements. An important use of the uniform field is manipulating particles in a vessel.

In another aspect, the invention is an electromagnet that may be used as one of the electromagnets in the apparatus for producing a magnetic field. In still another aspect, the invention is a kit for retrofitting a reactor vessel that employs magnetic enhancement with the apparatus for producing a magnetic field.

Other objects and advantages will be apparent to those skilled in the arts to which the invention pertains upon perusal of the following Detailed Description and drawing, wherein:

Figure 1:
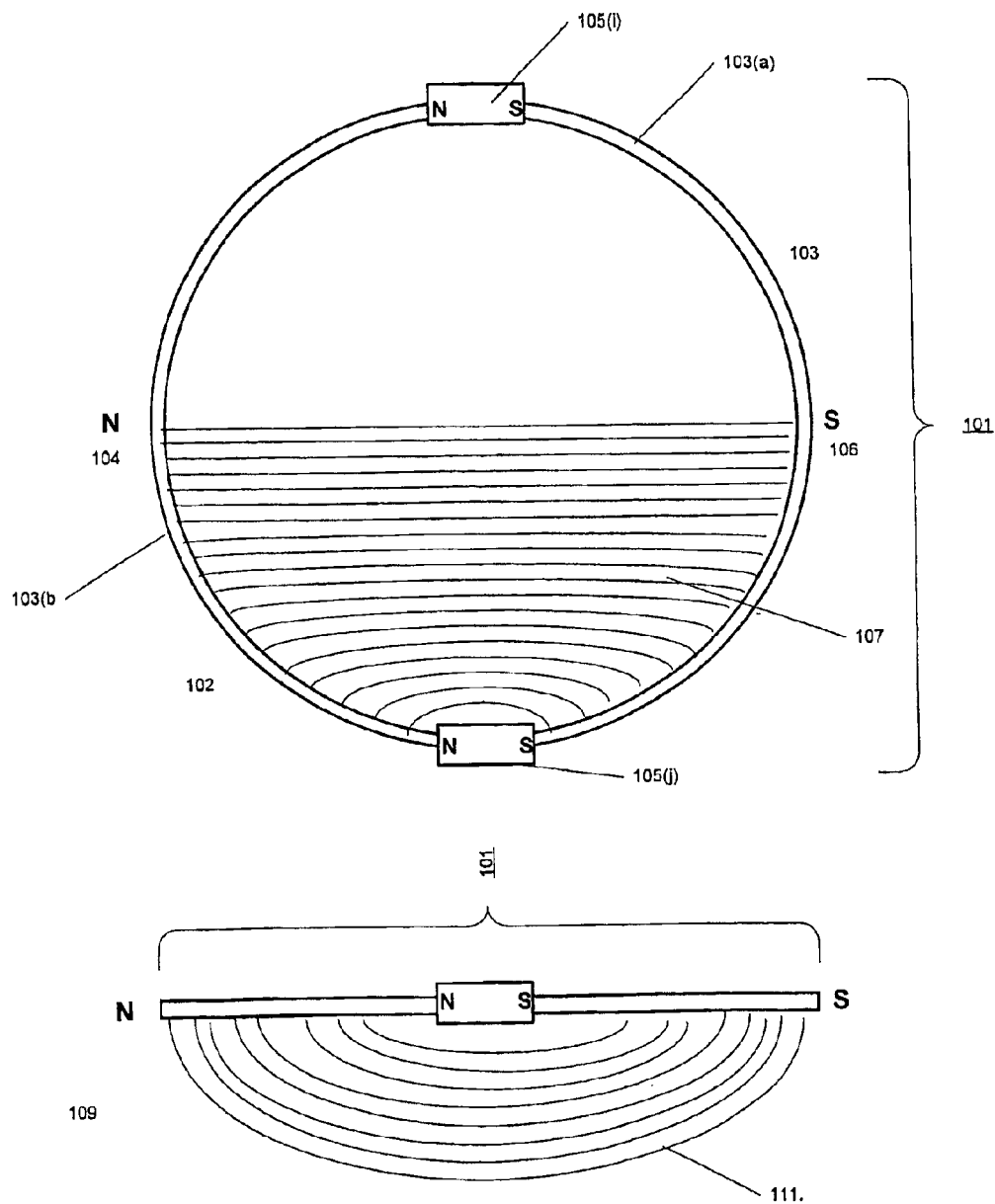
FIG. 1 shows the magnetic field generated by an electromagnet consisting of two coils on opposite sides of a circular core which are powered such that the poles of coils oppose each other.

Reference numbers in the drawing have three or more digits: the two right-hand digits are reference numbers in the drawing indicated by the remaining digits. Thus, an item with the reference number 203 first appears as item 203 in FIG. 2.

DETAILED DESCRIPTION

The following Detailed Description will first present an overview of the invention, will then disclose a preferred embodiment of an electromagnet that may be used in the invention, and will finally disclose how existing reactor vessels may be retrofitted with the invention.

Overview of the Invention

The following overview will first describe a type of magnet used in the invention in which the magnetic field is produced using opposed magnetic elements, will then describe how magnetic fields may be made by arranging such magnets above each other, and will finally describe a particularly useful arrangement of such magnets which is termed herein a Helmholtz core arrangement.

A Magnet in Which the Magnetic Field is Produced by Opposing Magnetic Elements: FIG. 1

FIG. 1 shows a magnet 101 in which two active magnetic elements 105(i) and (j) of equal strength are connected by a circular core 103 of a magnetically permeable material. The magnetic elements may be either electromagnets or permanent magnets. A top view of the magnet is shown at 102 and a side view at 109. The magnetic elements 105(i) and (j) are arranged as shown in FIG. 1: namely, one side of core 103 connects the north poles of the elements 105 and the other side connects the south poles of the elements.

The part of the magnetic field that results from this arrangement which is inside core 103 is shown as viewed from the top at 107 and as viewed from the side at 111. The magnetic field is represented by field lines. Top view 107 shows the field lines as viewed from above and side view 111 shows the field lines as viewed from the side. Because the poles of magnets 105(i) and (j) connected by the cores are opposed, the magnetic field is forced out of the cores and north pole 104 for the entire magnet 101 is equidistant between magnetic elements 105(i) and (j) on core portion 103(b), while south pole 106 for the entire magnet 101 is equidistant between magnetic elements 105(i) and (j) on core portion 103(b). Seen from the top, the field lines within the circle defined by magnet 101's core run as shown at 107. Only ½ of field 107 is shown here; the other half is symmetrical to what is shown here. As seen from the top, field lines appear as curves that approach straight lines as the parts of the opposite sides of the core connected by the lines of force approach north pole 104 and south pole 106. Because magnetic fields running in the same direction repel each other, the magnetic field lines as seen from above are distributed uniformly across the circle defined by core 103. In the area in the neighborhood of north pole 104 and south pole 106, the mutual repulsion of the magnetic field produced by element 1050) and those (not shown) in the magnetic field produced by element 105(i) results in field lines in the area around the center of the circle defined by magnet 101 that when seen from above are parallel and spaced uniform distances apart.

Of course, the magnetic field produced by magnet 101 actually also runs through the space above and below the surface defined by magnet 101, as shown in side view 109. The field lines representing the magnetic field produced by magnet 101 have the curves shown at 111 when viewed from the side. Again, only ½ of the side view is shown; the portion of the field above the surface is symmetrical to the portion below.

Figure 11:
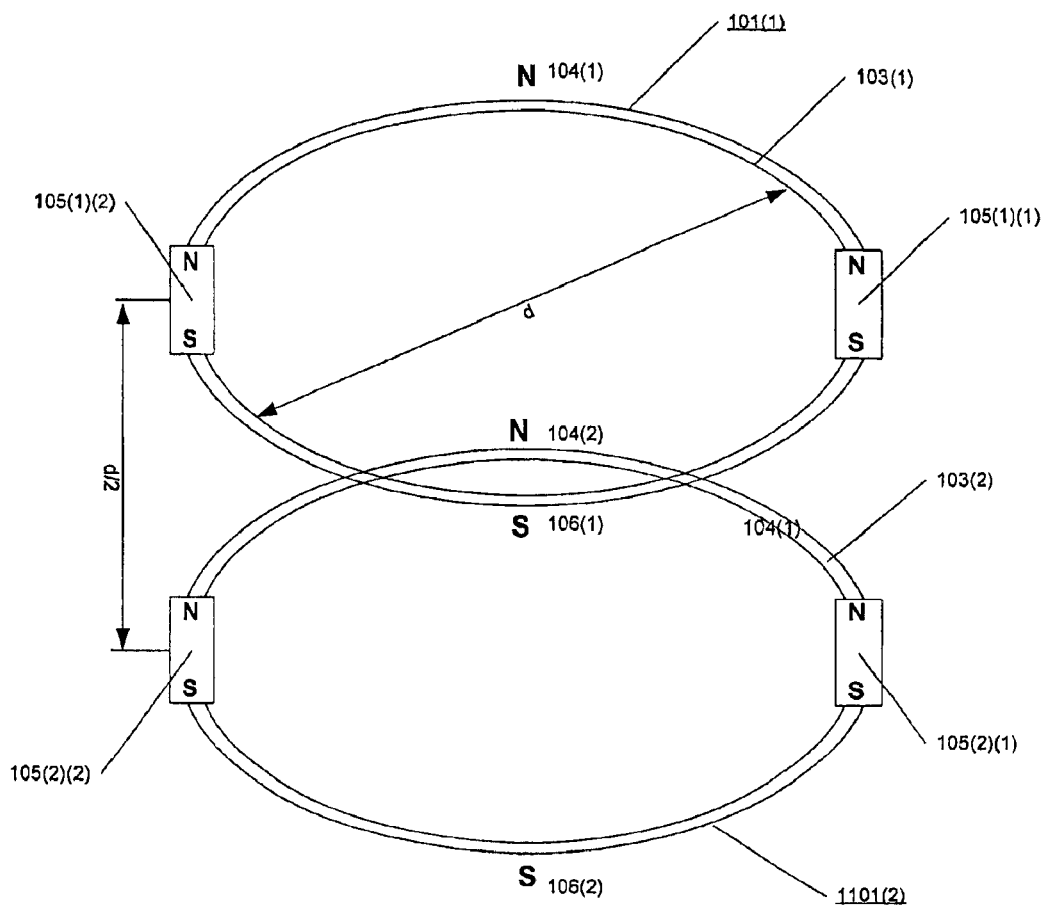
FIG. 11 shows an overview of a Helmholtz core arrangement that uses the magnets 105.
Figure 12:
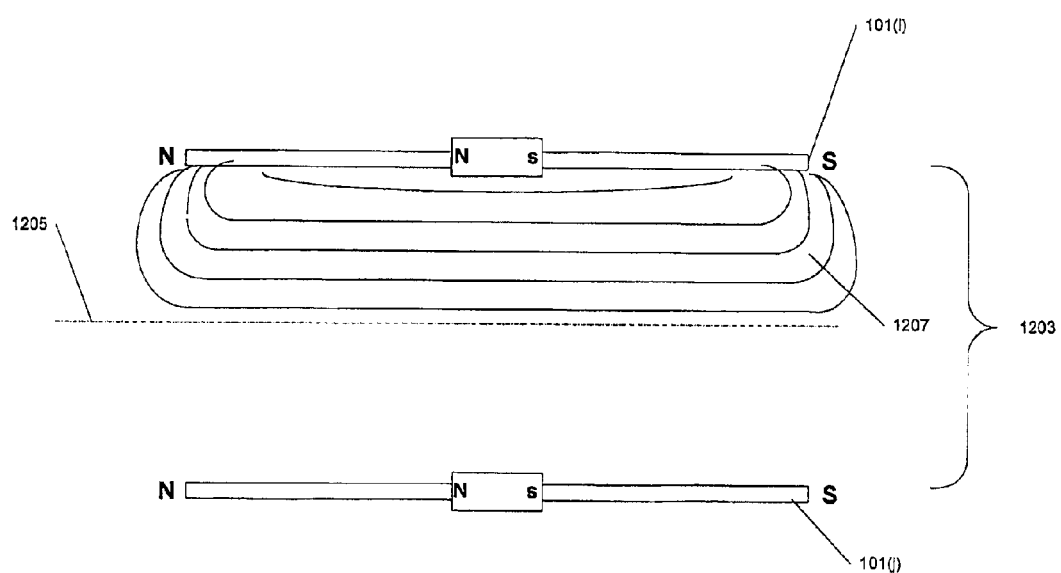
FIG. 12 shows magnetic fields produced by the Helmholtz core arrangement of FIG. 11.

Using Sets of Magnets 101 to Generate Magnetic Fields: FIGS. 11 and 12

FIG. 11 shows an arrangement 1101 of two magnets 101 in which the magnets 101 define parallel planes and the circles defined by the cores are centered on a line which is perpendicular to the parallel planes. When the magnetic field produced by a single magnet 101 is looked at in the context of arrangement 1101, it will be immediately seen that the magnetic field in the volume between the two magnets must be the resultant of the magnetic field produced in the volume by each of the magnets 101. As shown, corresponding magnetic elements 105 of each of the magnets 101 are on lines perpendicular to the planes defined by the magnets and are oriented in the same way. Thus, the corresponding poles of the magnets 101 are also on lines perpendicular to the planes. That of course means that the magnetic fields generated in the space between the magnets 101 repel each other. The effect of this repulsion is shown in FIG. 12, which is a side view of arrangement 1101. Because magnetic field 1203 is the resultant of the magnetic fields produced between the magnets 101, and because the two magnetic fields repel each other, the field lines in magnetic field 1207 are flattened compared with the lines shown at 111 in FIG. 1. Again, the portion of magnetic field 1203 below line 1205 is symmetrical to the portion 1207 above line 1205 and is not shown.

As is immediately apparent from FIG. 12, arrangement 1101 may consist of any number of magnets 101 arranged on parallel planes in the same fashion as magnet 101(1) and 101(2). Such arrangements are useful for manipulating magnetic fields in long vessels such as pipes. In the following, magnets of type 101 that have identical cores and arrangements of elements 105 will be termed congruent magnets 101; those that have the same arrangement of elements 105 on the core but are of a different size will be termed similar magnets 101.

Many versions of arrangement 101 may be constructed. For example, core 103 may have more than two elements 105. Particularly useful configurations in this regard employ pairs of elements 105 on opposing sides of the core. If the elements are electromagnets, changing the direction and amounts of power to the elements permits creation of fields having many different configurations, and if the changes are sequenced properly, the fields may be made to rotate. The cores may define many shapes. Closed curves are useful and polygons with parallel sides are particularly useful. While planar magnets 101 are simple and useful, the magnets 101 may define non-planar surfaces. The distances between the magnets 101 may also be varied as the application requires.

Helmholtz Core Arrangements: FIGS. 11 and 12

A particularly effective version of arrangement 1101 is the Helmholtz core arrangement. As shown in FIG. 11, in a Helmholtz core arrangement, congruent magnets 101 are arranged in parallel planes with corresponding elements 105 being on lines perpendicular to the parallel planes and the distance between the planes being that of the coils in a Helmholtz coil, that is, the distance between magnets 101 is approximately ½ the diameter of the rings. Magnetic field 1207 shown in FIG. 12 is generated by such a Helmholtz core arrangement. The Helmholtz geometry produces a uniform field as does a standard Helmholtz coil, but the uniform field is produced by the repulsive interaction of the fields generated by the magnets 101. The uniform field is in the center of the volume defined by the magnets 101 and is parallel to the planes of the magnets 101. Again, more than 2 magnets 101 may be used to produce a uniform magnetic field of any length. In such an arrangement, termed a picket fence arrangement herein, each pair of adjacent magnets in the set of magnets has the Helmholtz core arrangement. To produce the uniform field, the fields produced by the magnets that are not at the ends of the picket fence arrangement should have a magnitude 25% less than those produced by the magnets at the ends of the arrangement.

Even in simple Helmholtz core arrangement 1101, the use of windings for magnetic elements 105 permits some manipulation of the uniform magnetic field. By varying the current in the coils, the strength of magnetic field 1203 may be varied, and by reversing the current direction in the coils 1107, the polarity of the magnetic field may be reversed. However, even in this arrangement, if separate power supplies are provided to the coils which make up the corresponding magnetic elements 105, so that elements 105(1)(1 and 2) and elements 105(2)(1 and 2) receive differing amounts of power, a magnetic field with a vertical gradient may be established between magnets 101(1) and (2). As the number of opposing pairs of coils on magnet 1103 increases, the number of possible manipulations increases. For example, by adding another opposing pair of coils on each magnet 101 at 90° to the first pair, the directions and magnitudes of the power provided to the coils can be sequenced in a fashion which causes magnetic field 1203 to rotate smoothly around the line upon which the magnets 101 are centered. The number of possible manipulations can be further increased by providing separate power supplies for the coils and by increasing the number of coils.

Theory of the Helmholtz Core Arrangement

A useful way of thinking about the Helmholtz core arrangement is the following: the magnetic field lines of the magnetic field generated by magnet 101 within the circle defined by core 103 define field surfaces that are perpendicular to the plane of the magnet. Because of the effects of repulsion, as the poles of 104 and 106 of magnet 101 are approached, the surfaces become increasingly planar and are increasingly at uniform distances from each other, as seen at 107 in FIG. 1. Thus, there is an area on either side of a line drawn between north pole 104 and south pole 106 where the field surfaces become parallel field planes that are at equal distances from each other.

When a pair of magnets 101 are arranged as shown in FIG. 11, the field surfaces of the magnetic fields generated by the magnets 101 are aligned with each other in the area between the magnets. Each aligned surface has field lines from both magnets 101, and these field lines all repel each other. As a result, the field lines in the aligned surfaces become more and more parallel as the center of the space between the magnets 101 is approached, as shown at 1207 in FIG. 12. Since the aligned surfaces also become more and more parallel as the center of the space is approached, there is an area around the center of the space in which the field lines become parallel. These parallel field lines define not only the parallel planes of FIG. 1, but also a set of parallel planes that are parallel to magnets 101. Each of the parallel field lines is at the intersection of a plane that is perpendicular to the magnets 101 and one that is parallel to it.

As indicated above, the uniform magnetic field produced by the Helmholtz core arrangement can be manipulated by adding electromagnets to the Helmholtz core arrangement and varying the magnitude and direction of the current that is provided to these electromagnets. The entire uniform magnetic field can thus be rotated around the axis of arrangement 1101; if sufficient electromagnets are provided and the magnitude and direction of the current to the electromagnets is properly varied, the uniform field can be modified such that the planes defined by the field lines in the uniform magnetic field appear to have been tilted in a horizontal and/or vertical direction or warped in a horizontal and/or vertical direction.

Figure 2:
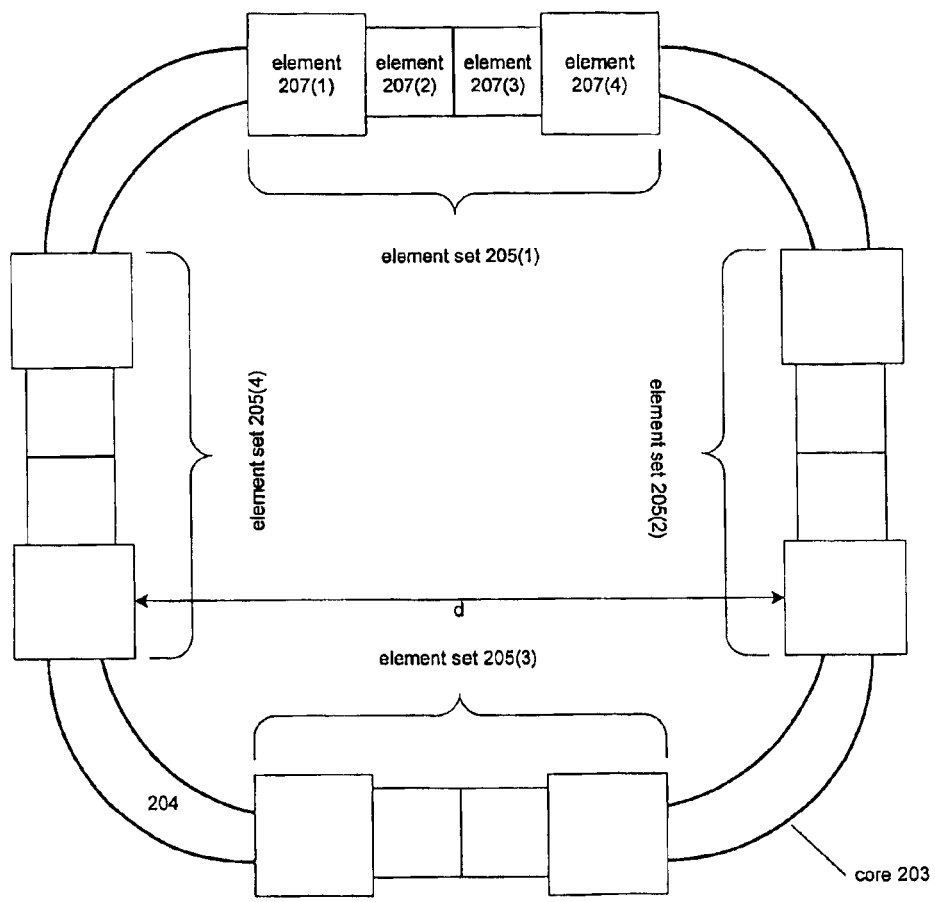
FIG. 2 shows a preferred embodiment 201 of an electromagnet 101.

A Preferred Embodiment of an Electromagnet 101: FIG. 2

FIG. 2 shows a presently-preferred embodiment 201 of an electromagnet 101 for use in a Helmholtz core arrangement. Electromagnet 201 is designed to be retrofitted to a MERIE vessel of the type described above in which four electromagnetic coils are attached to the sides of the vessel. Electromagnet 201 fits around the circumference of the vessel. The four electromagnetic coils are removed and in their place are installed two electromagnets 201 which are connected to the power supplies for the four coils. The two electromagnets are separated by a vertical distance of approximately d/2, or ½ the interior distance d between opposed element sets 205 of electromagnet 201. In an exemplary embodiment of electromagnet 201, the distance d is approximately 15 inches. The portion of the volume between the magnets 201 in which the field is highly uniform is centered on the vertical axis of the Helmholtz core arrangement and the plane midway between the magnets 201. The highly uniform area includes 50% of the horizontal distance d and 20% of the vertical distance d/2. Vertical displacements of the electromagnets 201 of 1 inch above and or below the distance d/2 of 7½ inches had no significant effect on the uniformity of the magnetic field.

Continuing in more detail, electromagnet 203 includes a ferrous core 203 which is shaped to fit within the form constraints imposed by the MERIE vessel being retrofitted. In electromagnet 201, the core consists of low-carbon steel bars connected by low-carbon steel cornerpieces 204. Wound around each bar is an element set 205 consisting of four coil elements 207. In the preferred embodiment, elements 207(1) and (4) are identical and have more windings than elements 207(2) and (3), which are also identical. The purpose of the extra windings in elements 207(1) and (4) is to compensate for the lack of windings on corner pieces 204. In an ideal element set 205, the number of windings would decrease smoothly until the center of the element set was reached and then would increase smoothly in the same fashion, but the approximation used in electromagnet 201 is sufficient for most purposes. In the preferred embodiment, elements 207(1) and (4) have N windings and elements 207(2) and (3) have ⅔ N windings. Indeed, if space restrictions make it necessary, an element set 205 for producing a rotating uniform field may consist only of element 207(1) and 207(4). Of course, the smaller number of elements reduces the extent to which the magnetic field can be manipulated. The manner in which elements 207 are connected to power supplies depends on the kind of magnetic field that is desired in an apparatus 101 made using electromagnets 201.

Figure 13:
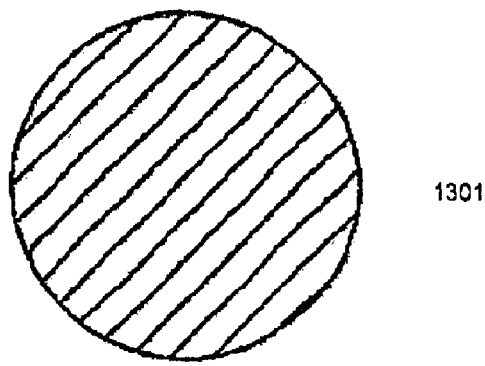
FIG. 13 shows different cross sections for a core of an electromagnet 201.
Figure 13:
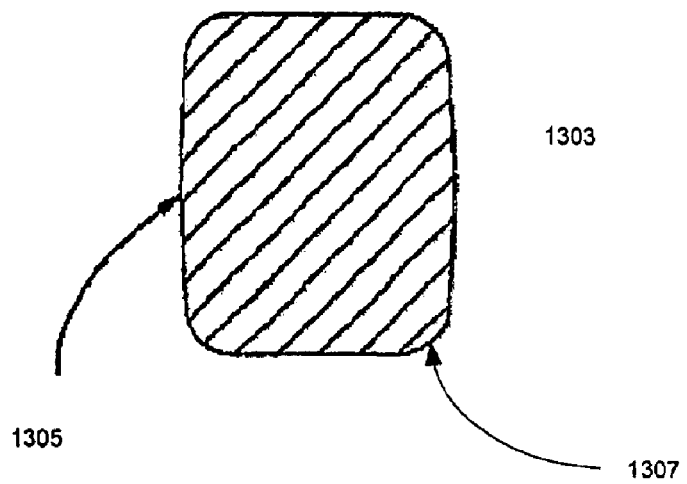

As may be seen from FIG. 2, element sets 205 and the bars they are wound on form a polygon (in this case, a square) around the circumference of the vessel, with the corner pieces 204 providing the corners of the polygon. The polygon may have any useful number of sides. If the fields produced by a set of electromagnets like electromagnet 201 are intended to rotate, the polygons must have opposing sides that are substantially parallel. The shapes and cross section of the corner pieces and the cross section of the bars are not critical. FIG. 13 shows two possible core cross sections. Circular cross section 1301 is preferred, but space constraints or constraints resulting from the environment into which an electromagnet 201 is retrofitted may require a rectangular cross section like that shown at 1303. In such a cross section, better contact between the windings and the core is possible when the sides of the rectangular core are convex, as shown at 1305, and the corners are rounded, as shown at 1307. Good contact between the windings and the core facilitates the transfer of heat from the windings to the corner pieces via the core.

Figure 14:
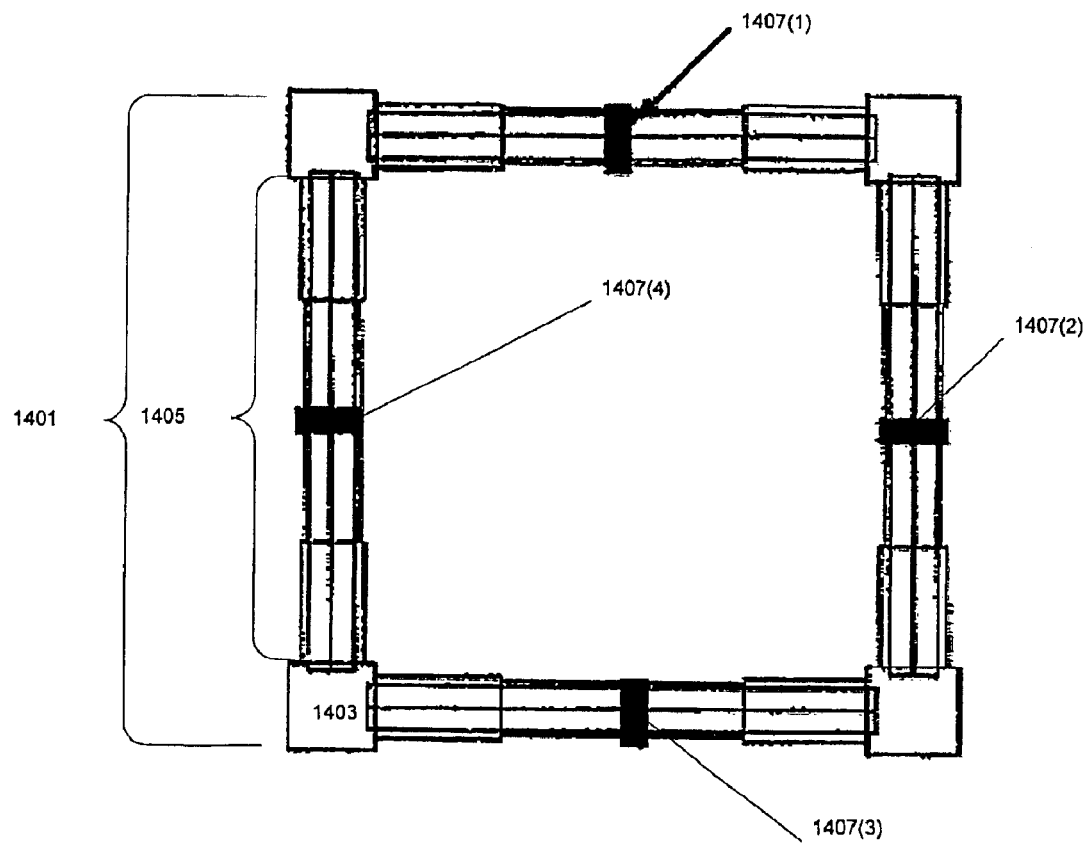
FIG. 14 shows how non-magnetic shims may be used for fine adjustments in an electromagnet 201.

There is no requirement that core 203 be continuous; indeed, non-magnetic shims between portions of core 203 may be used for fine adjustment of the magnetic fields produced by electromagnet 201, as shown in FIG. 14. There, shims 1405 are used in a version 1401 of electromagnet 201 with square corner pieces 1403. A shim 1407 has been placed in the center of each of the magnet's bars 1405. The effect of the shims of FIG. 14 in a rotating magnetic field when the cores are saturated is to preferentially inhibit the strength of the field generated by a Helmholtz core arrangement of the magnets 1401 in one direction with regard to the field generated at 45° when the field is rotated. Preferentially inhibiting the field's strength in this manner may be used to correct at least partially for inevitable air gap field differences caused by saturation effects at 0° and 45°. Shims can also be used for field correction in situations where saturation and/or rotation are not involved. The magnetic field may also be adjusted by altering the shapes of the core and corner pieces. Examples of problems that can be dealt with by these fine adjustments include less than ideal distances between the electromagnets 201, less than ideal element locations, or saturation effects in the core.

Figure 15:
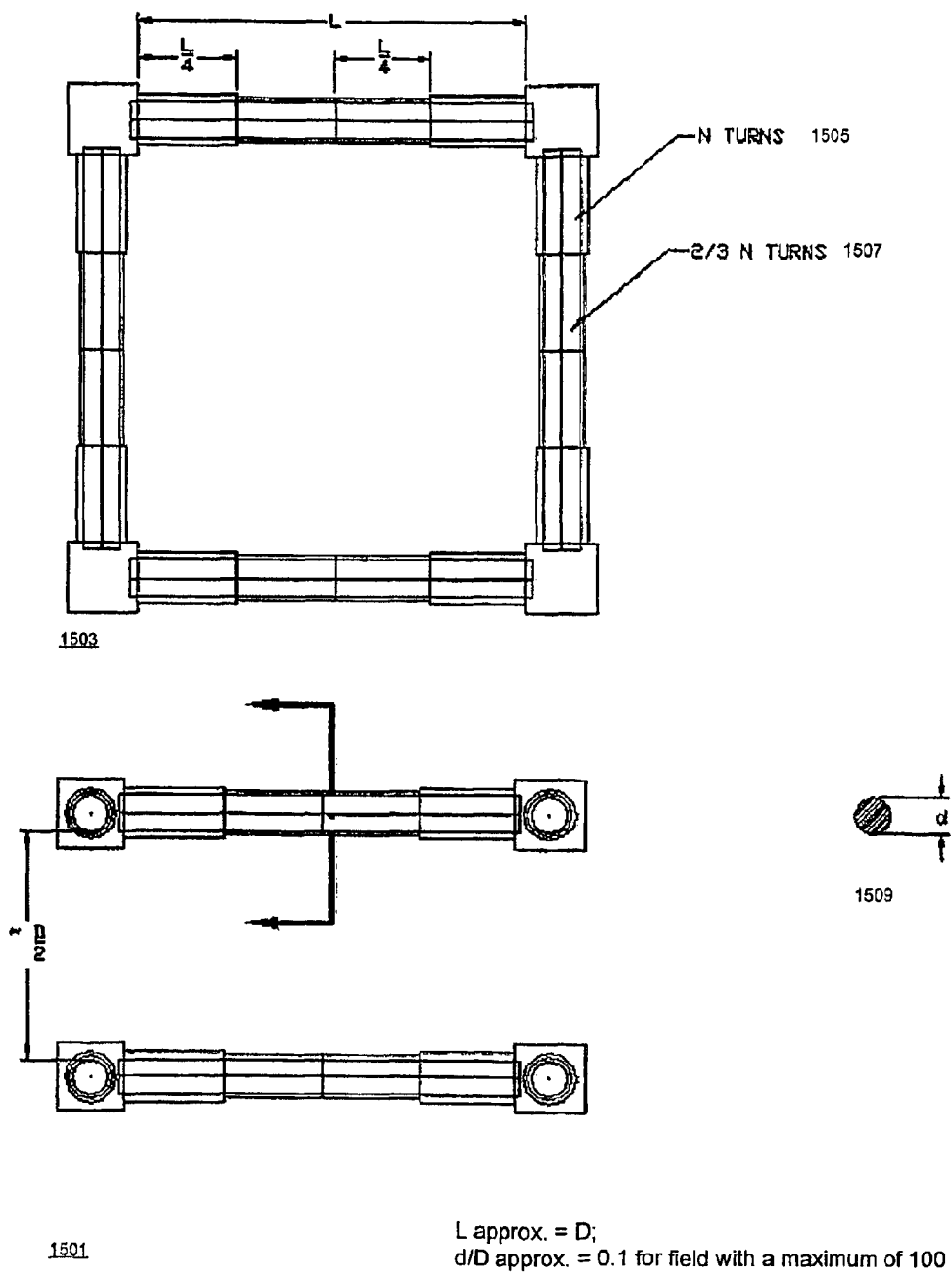
FIG. 15 shows details of a preferred embodiment of an electromagnet 201.

FIG. 15 shows a Helmholtz core arrangement 1501 made with two electromagnets 1503 which form squares with square corner pieces. The dimensions of Helmholtz core arrangement 1501 are given in terms of the length L of the bar upon which the elements 1505 and 1507 are wound.

The distance between the electromagnets 1503 is thus approximately L/2 and each element 1505 or 1507 has a length of L/4. Element 1505 has n turns and element 1507 has ⅔ n turns. As shown at 1509, the bar has a circular cross section and the relationship between the diameter d of the circular cross section and the length L is such that d/L is approximately equal to 0.1 where maximum field strength of 100 Gauss is desired.

Examples of Magnetic Fields Generated Using an Apparatus 101 with Two Electromagnets 201:

FIGS. 3–9

FIGS. 3–9 show how the uniform magnetic field generated by a simple Helmholtz core arrangement can be further manipulated by varying the magnitudes and directions of the currents flowing through the elements 207. The figures show the magnetic field generated in a Helmholtz core arrangement of two electromagnets 201 at position 1205 midway between the electromagnets with various combinations of magnitude and direction of current to the elements 207. In each of these figures, the magnetic field is shown by means of an array of freely rotating magnetic needles 303 which is mounted on a card that occupies position 1205. Each figure also includes a schematic representation of electromagnet 201 in which element set 205(1) is labeled N, set 205(2) is labeled E, and so on. Elements 207 are shown as square boxes numbered 1–4, with box 1 corresponding to element 207(1), box 2 to element 207(2), and so on. The heavy arrows 305 above the element sets 205 show the direction of the magnetic field in the elements making up the set. Thus, the magnetic field in elements 207(1) and (2) of element set 205(1) has the opposite direction from that in elements 207(3) and (4). The direction of the magnetic field produced by an element is of course determined by the direction in which the current flows through the element. What elements have current flowing through them and the relative strengths of the magnetic fields produced by the elements that have current can be seen from table 307, which specifies the ampere turns used in each element to produce the magnetic field shown at 303. Thus, in the case of FIG. 3, the concave magnetic field 301 shown by the needles is produced by providing 1722 ampere turns to elements 207 2 and 4 in each of the E and W element sets 205 in the direction required by the arrows 305 for those elements and 3366, 2417, 2417, and 3366 ampere turns to elements 207(1)–(4) respectively of element sets 207 1 and 3 in the directions required by the arrows 305 for those elements in both of the magnets 201(1) and (2).

Figure 3:
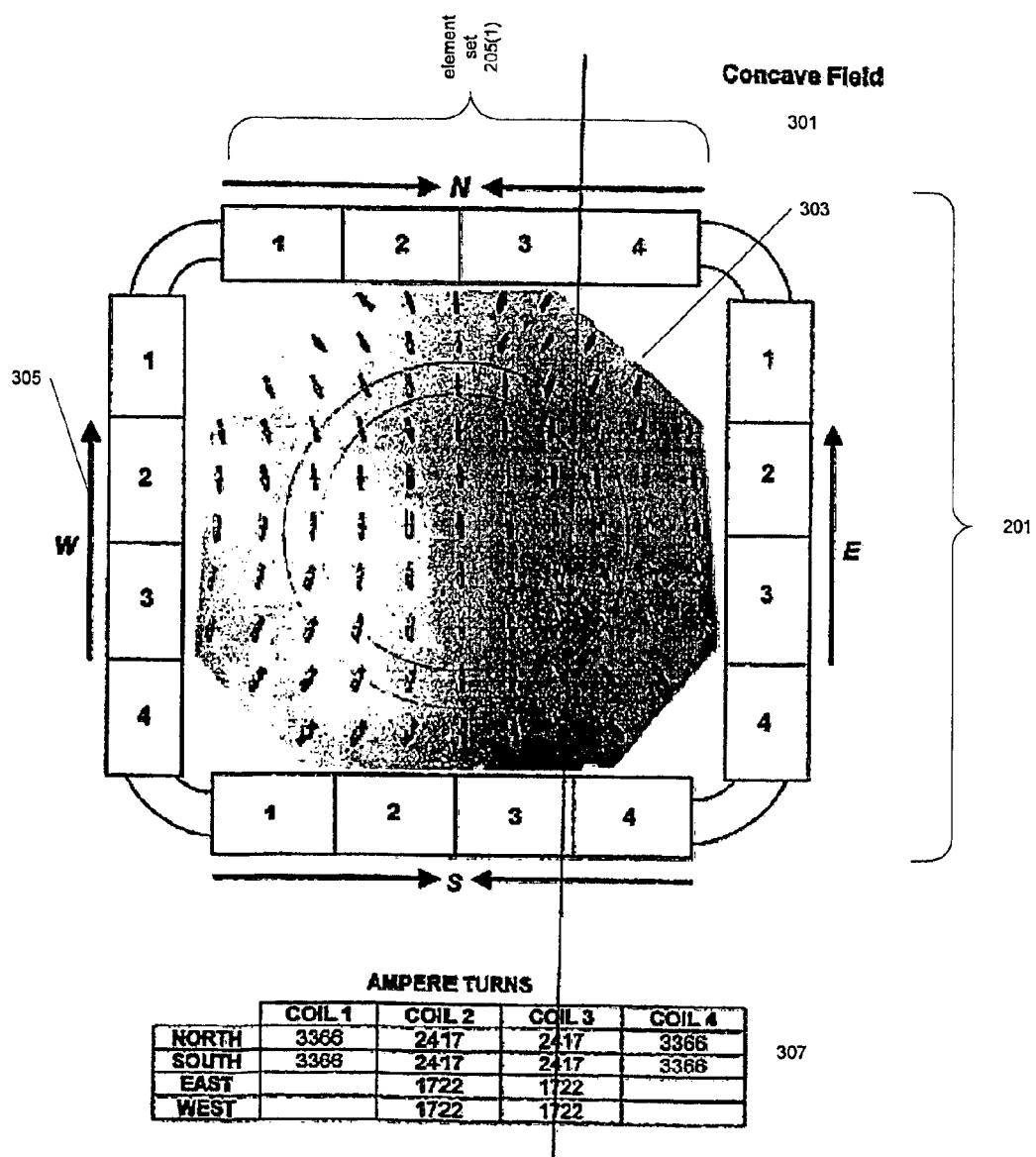
FIGS. 3–8 show magnetic fields produced by a Helmholtz core arrangement which employs a pair of magnets 201.

Continuing in more detail about individual FIGS. 3–8,

FIG. 3 shows how a concave field 301 may be produced as shown at 303 with power supply connections to the elements 207 that produce the ampere turns indicated at 307.

Figure 4:
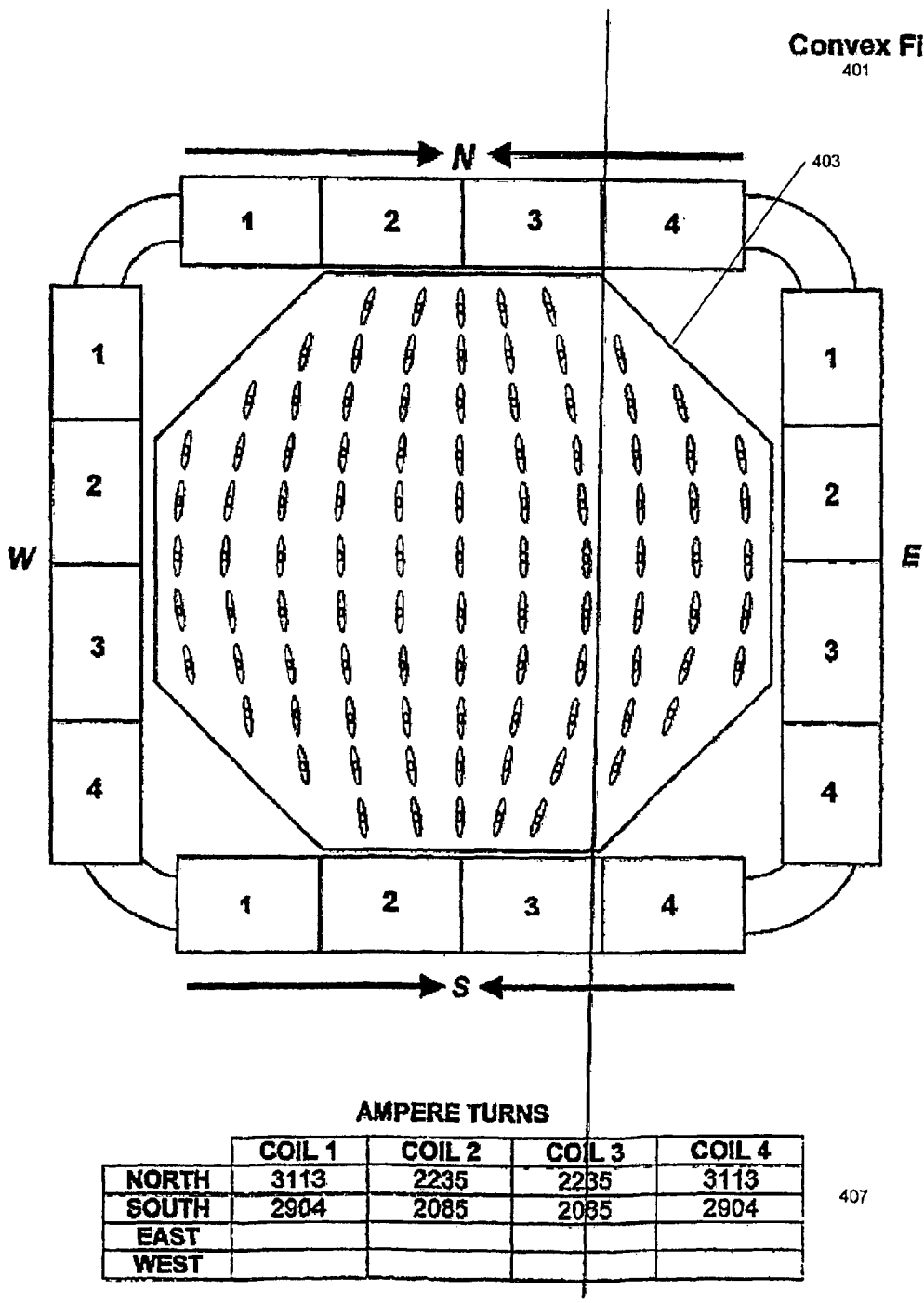

FIG. 4 shows how a convex field 401 may be produced as shown at 403 with power supply connections to the elements 207 that produce the ampere turns indicated at 407.

Figure 5:
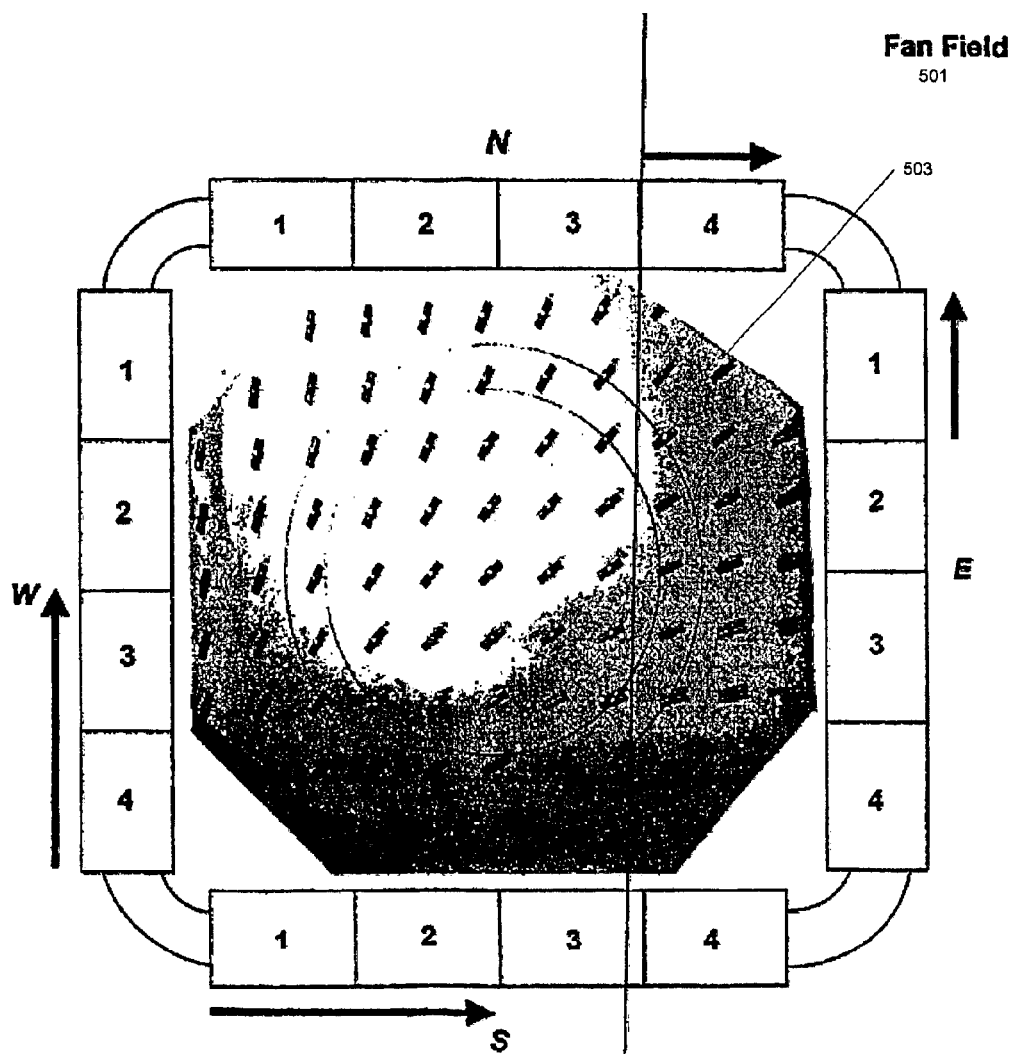

FIG. 5 shows how a SW–NE oriented fan field 501 may be produced as shown at 503 with power supply connections to the elements 207 that produce the ampere turns indicated at 507.

Figure 6:
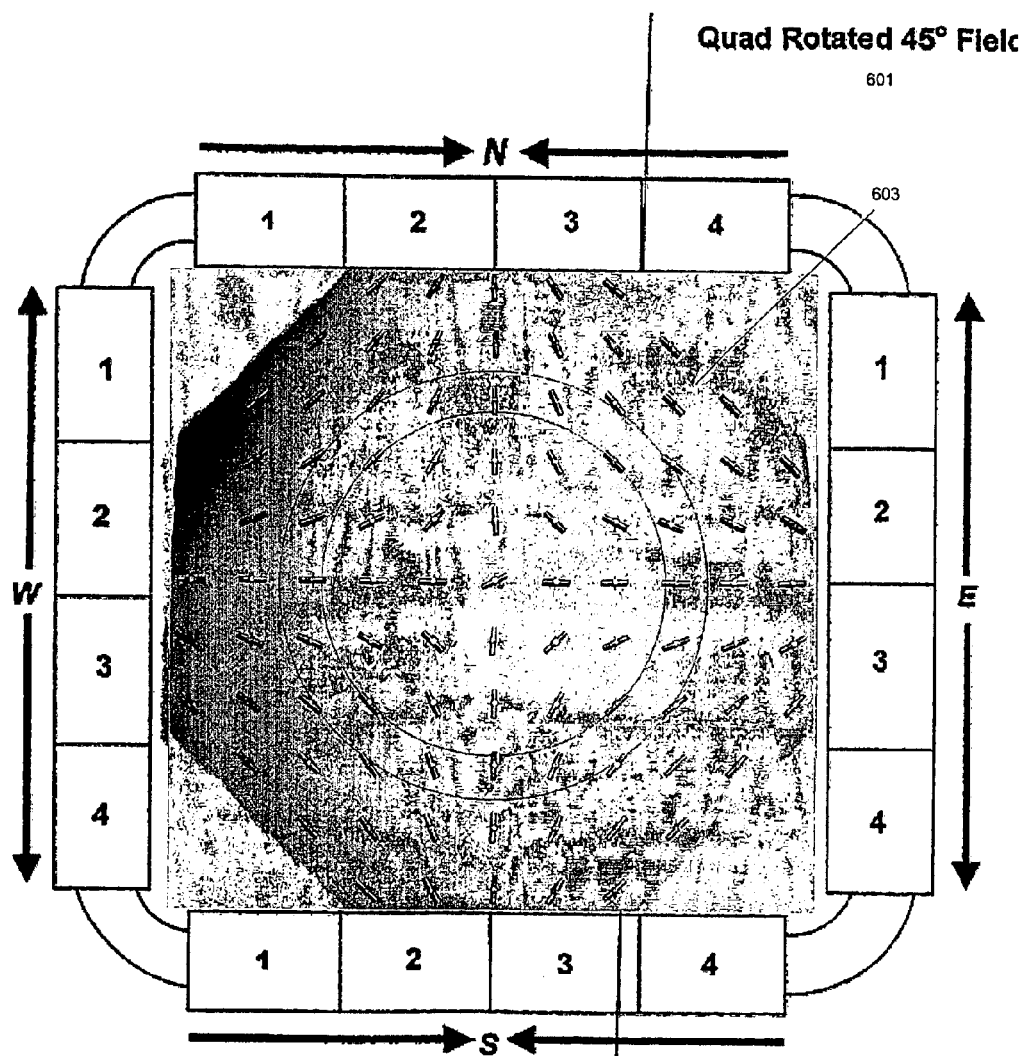

FIG. 6 shows how a quad field 601 may be produced as shown at 603 with power supply connections to the elements 207 that produce the ampere turns indicated at 607.

Figure 7:
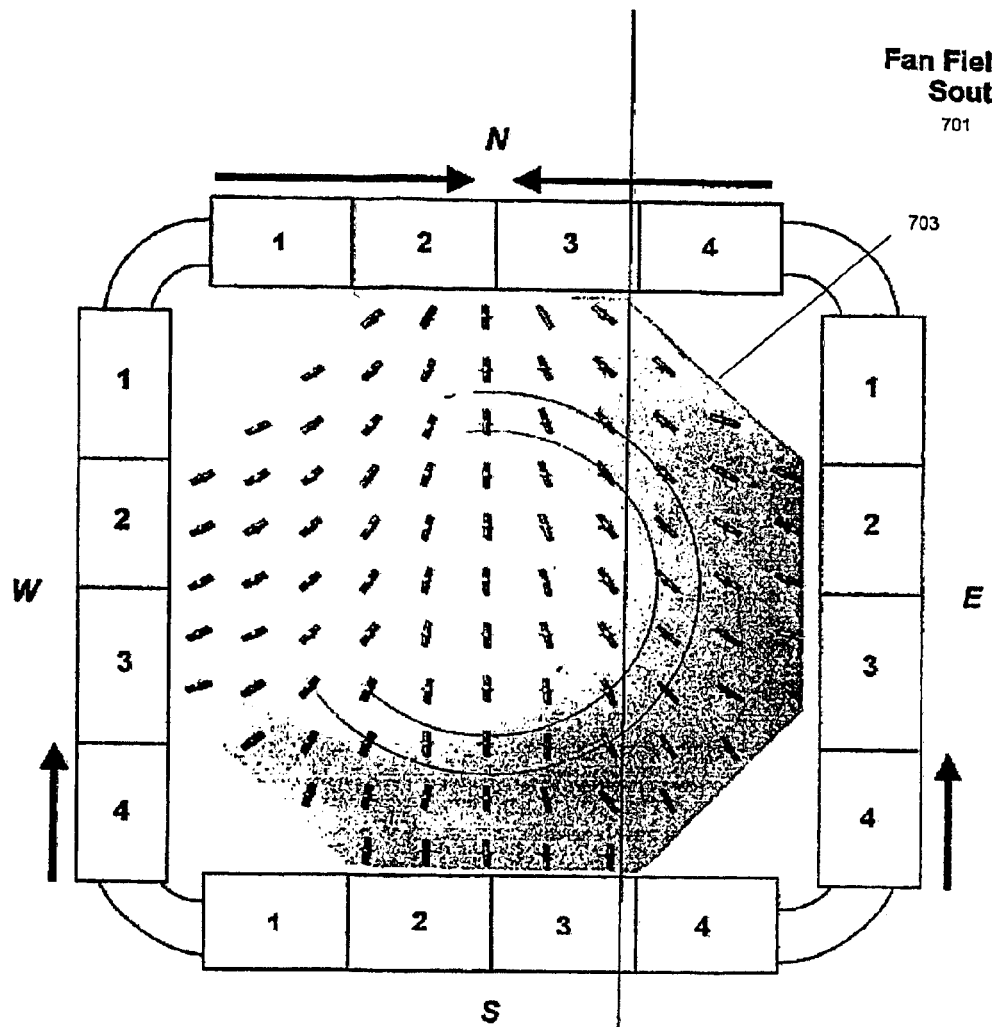

FIG. 7 shows how an N–S oriented fan field 701 may be produced as shown at 703 with power supply connections to the elements 207 that produce the ampere turns indicated at 707.

Figure 8:
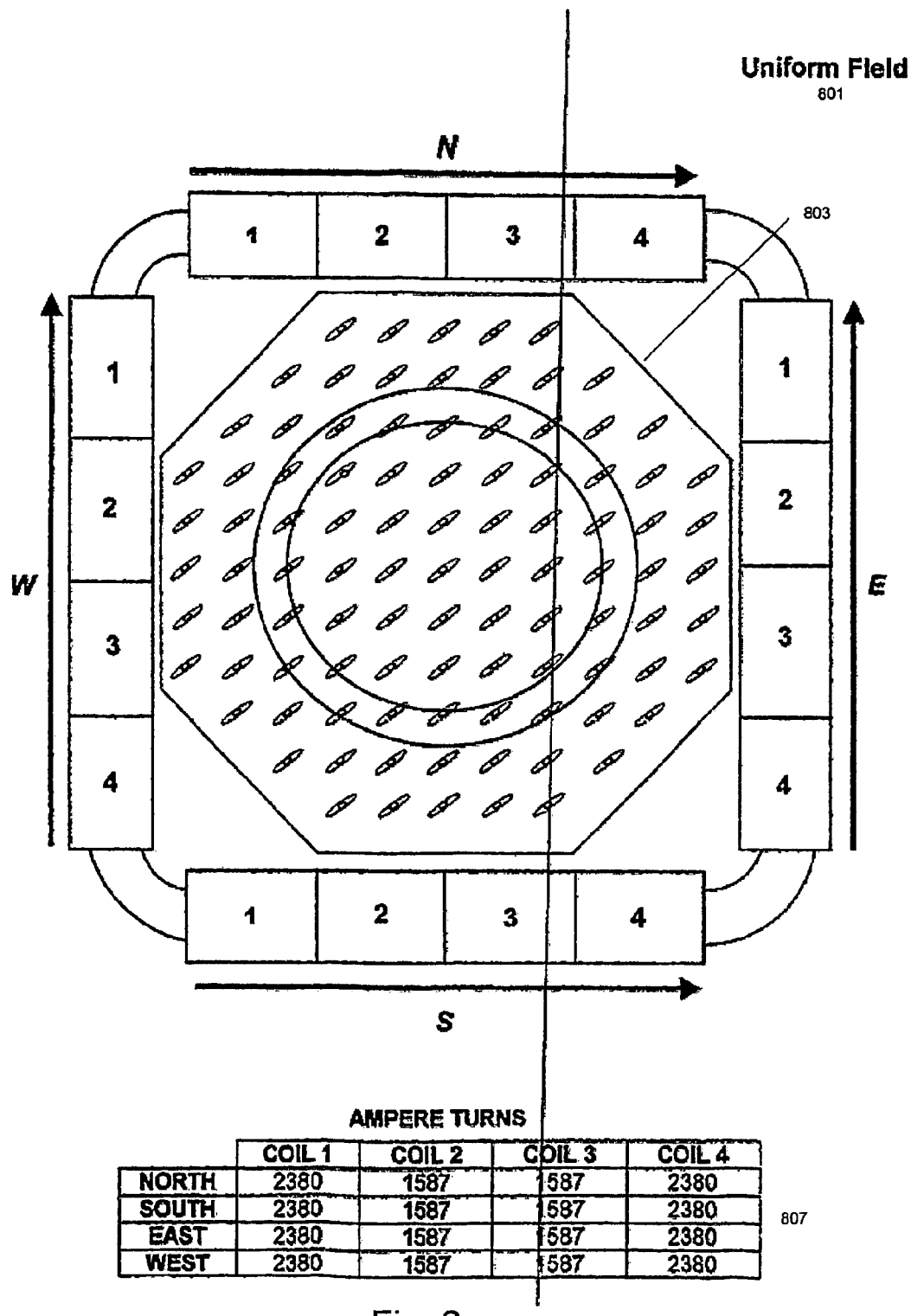

FIG. 8 shows how a uniform field 801 may be produced as shown at 803 with power supply connections to the elements 207 that produce the ampere turns indicated at 807. Of course, any of the above fields may be rotated by sequencing the amount and direction of power provided to each of the element sets 205 and vertical gradients may be introduced in any of the fields by providing differing amounts of power to corresponding elements in upper magnet 201(1) and lower magnet 201(2).

Figure 9:
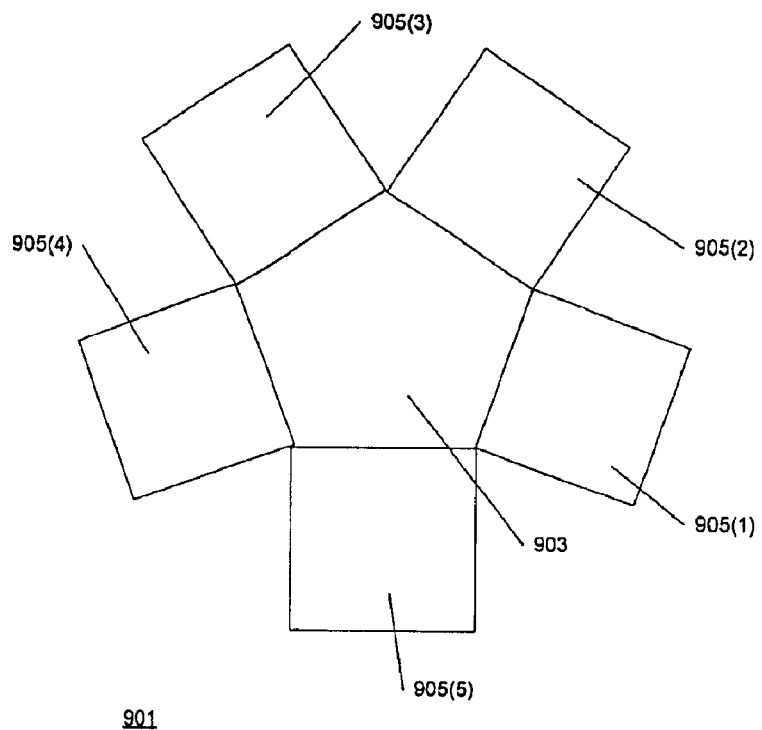
FIG. 9 shows a system of MERIE vessels which may be retrofitted with electromagnets 201.
Figure 9:
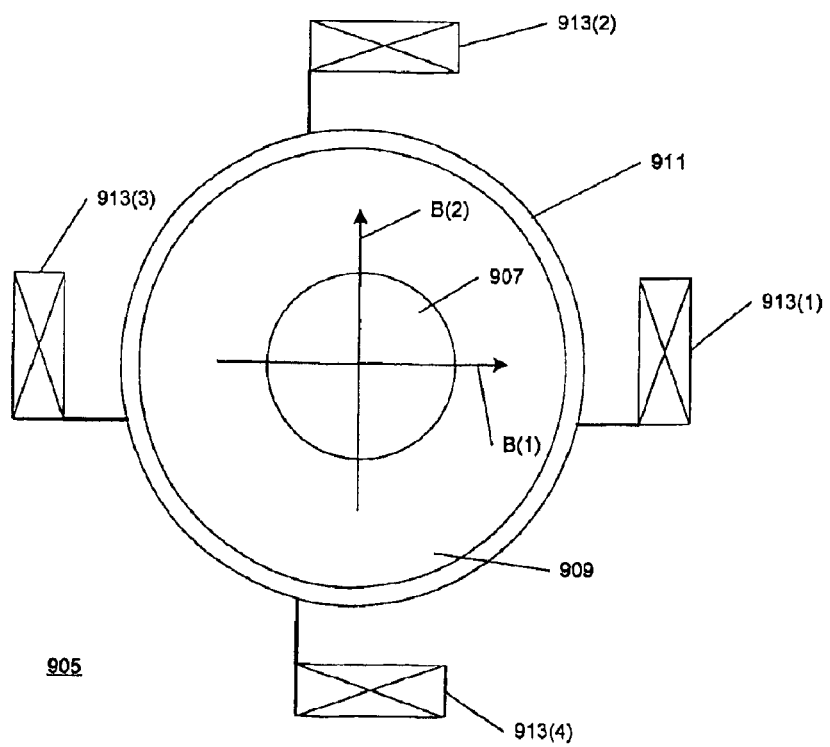

Retrofitting an Electromagnet 201 to an Existing MERIE Apparatus: FIG. 9

FIG. 9 is based on figures from U.S. Pat. No. 5,809,442, Olmer, et al., Silicon dioxide deposition method using a magnetic field and both sputter deposition and plasma-enhanced CVD, issued Feb. 18, 1992. The method described in the patent is applied in the system of FIG. 9. The system employs 5 MERIE reactors 905(1 . . . 5) of the type shown at 905 in the configuration shown at 901. In the center of configuration 901 is transfer chamber 903. Each of the 5 MERIE reactors has a closable port that opens onto transfer chamber 903. A robot arm in transfer chamber 903 can transfer wafers from one MERIE reactor 905 to another. Configuration 901 thus permits performance of multiple steps of wafer processing at a single location. MERIE reactors 905 are of the type described in the Description of related art. Reactor 905 has an interior chamber 909 with a table 907 upon which a wafer may be mounted for processing. Around chamber wall 911 are arranged four coils 913(1 . . . 4), each of which has two horizontal and two vertical legs. Each of the coils has its own power supply. A magnetic field is generated in interior chamber 909 by activating a pair of adjacent magnets (for example, 913(1) and (2)) with current flowing in one direction one power supply and the opposite pair (913(3) and (4)) with another current flowing in the opposite direction form another power supply. By sequencing the manner and direction in which power is provided to the coils, the magnetic field can be made to rotate.

Successful retrofitting requires that the fewest possible changes be made to the system which is being upgraded. In the context of system 901, what this means is that the retrofitting cannot disturb the arrangements used to transfer wafers among the reactors 905 and to introduce gases into the reactors and that the retrofitted reactor should be able to use the same power supplies as the original reactor. Helmholtz core arrangements of electromagnets 201 are particularly suited to dealing with the above constraints. As shown in FIG. 8, only two power supplies are needed to produce a rotating uniform field 803; four are typically available in a reactor 905. Moreover, the facts that the electromagnets 201 in the Helmholtz arrangement are a good distance apart and that the surface of table 907 that holds the wafer is approximately midway between the electromagnets 201 mean that the Helmholtz core arrangement does not interfere with the closable ports or the robot arm. Finally, the square configuration of magnets 201 means that the mounting arrangements for coils 913(1 . . . 4) may be easily adapted for mounting magnets 201.

Figure 10:
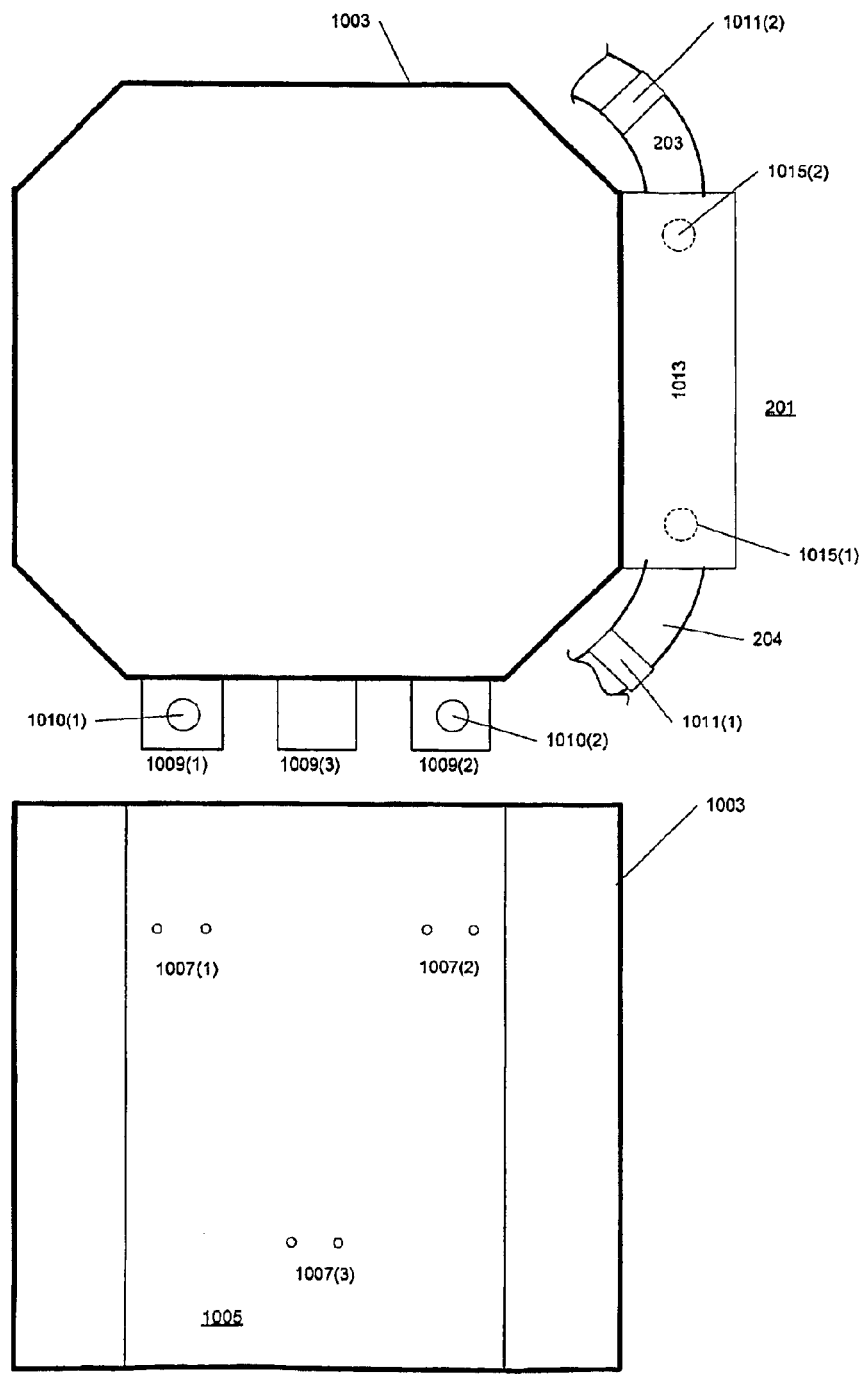
FIG. 10 shows details of the arrangements for retrofitting a vessel with an electromagnet 201.

FIG. 10 shows details 1001 of retrofitting to a reactor 905. A top view is shown at 1002 and a side view at 1004. As shown at 1002, reactor vessel 1003 has an octagonal cross section. The octagon has four long sides and four shorter sides. The coils 913 were mounted on the long sides. Side view 1004 shows one of the long sides 1005; all that is left of the mounting arrangements for the coil 913 are tapped holes 1007(1 . . . 3); the other sides have similar tapped holes.

Top view 1002 shows a portion of electromagnet 201(1) and the arrangements for mounting electromagnet 201(1) and (2) on side 1005. As set up for retrofitting, electromagnet 201 is made with a core consisting of four bars around which the coil elements 105 are wound and four corner pieces 204. Each element set 205 is potted to make a single rectangular structure 1013. Electromagnet 201 is assembled during retrofitting by connecting the bars with the corner pieces.

Each electromagnet 201 is supported by brackets like brackets 1009 on the long sides. The brackets are attached to the sides by screws that pass through the brackets and into tapped holes 1007; as shown, there are three sets of tapped holes on side 1005 and a bracket corresponding to each set of holes. Brackets 1009(1) and (2) support electromagnet 201(1), while bracket 1009(3) supports electromagnet 201(2). Similar brackets are employed to support electromagnets 201(1) and (2) on the other sides. Electromagnet 201(1) is assembled so that it sits on top of the top brackets and electromagnet 201(2) is assembled so that it sits below the bottom brackets. A strap 1011 at each corner of the electromagnets 201 runs around the corresponding corner pieces of electromagnet 201(1) and (2) and is tightened to urge the electromagnet 201(1) against the top brackets and electromagnet 201(2) against the bottom brackets. Depressions such as those shown at 1010 in the brackets correspond to bumps 1015 in rectangular structure 1013 and prevent slippage of the electromagnets 201 on the brackets. Once the electromagnets 201 have been mounted on reactor vessel 1003 in the manner just described; all that is required to complete the retrofitting is connecting the elements 207 to the original power supplies as required to produce the desired magnetic field.

CONCLUSION

The foregoing Detailed Description has disclosed to those skilled in the technology of building magnets how to make and use the apparatus for manipulating magnetic fields disclosed herein. The Detailed Description has further disclosed the best modes presently known to the inventor of making and using his invention. It will be immediately apparent to magnet builders that the underlying principles of the techniques disclosed herein are very general and that many different kinds of apparatus may be constructed which will produce magnetic fields according to the principles disclosed herein. It will further be apparent that the magnetic fields produced using the techniques disclosed herein have many applications in addition to the ones described herein, and that the ways in which the disclosed techniques are applied will vary from application to application. For all of these reasons, the Detailed Description is to be regarded as being in all respects exemplary and not restrictive, and the breadth of the invention disclosed here in is to be determined not from the Detailed Description, but rather from the claims as interpreted with the full breadth permitted by the patent laws.

What is claimed is:

1. Apparatus for producing a magnetic field comprising:
  a first set of magnetic elements that define a first surface and produce a first magnetic field by repulsion between the fields produced by the magnetic elements, the first field extending normally to the first surface; and
  a second set of magnetic elements that define a second surface and produce a second magnetic field by repulsion between the fields produced by the magnetic elements, the second field extending normally to the second surface,
  the second set of magnetic elements being positioned relative to the first set of magnetic elements such that the surfaces are approximately parallel and the magnetic field is formed between the surfaces by repulsive interaction of the first and second magnetic fields.

2. The apparatus set forth in claim 1 wherein:
  one or more of the magnetic elements in the first and/or second sets is an electromagnetic element; and
  the magnetic field is manipulated by changing the direction and/or magnitude of the current in selected ones of the electromagnetic elements.

3. The apparatus set forth in claim 2 wherein:
  Each set includes a first pair of electromagnetic elements that produces at least part of the set's magnetic field by repulsion and a second pair of electromagnetic elements that produces at least part of the set's magnetic field by repulsion; and
  the magnetic field is manipulated by changing the direction and/or magnitude of the current in the corresponding pairs of electromagnetic elements such that a rotary motion is imparted to the magnetic field.

4. The apparatus set forth in claim 1 wherein:
  the first and second sets of magnetic elements comprise a pair of magnetic elements, the like poles of the elements in a pair being connected by a core; and
  the first and second sets of magnetic elements are positioned relative to each other such that a portion of the magnetic field is uniform.

5. The apparatus set forth in claim 4 wherein:
  the two magnetic elements in each set of magnetic elements are separated in the surface by a distance D; and
  the surfaces are separated by a distance of D/2.

6. The apparatus set forth in claim 4 wherein:
  the first and second sets further comprise at least one additional pair of magnetic elements having like poles connected by the core;
  the pairs of magnetic elements are electromagnetic elements; and
  the uniform magnetic field is manipulated by changing the direction and/or magnitude of the current in the pairs of electromagnetic elements such that a rotary motion is imparted to the uniform magnetic field.

7. The apparatus set forth in claim 4 wherein:
  the first and second sets further comprise further electromagnetic elements; and
  the uniform field is manipulated by changing the direction and/or magnitude of the current in the further electromagnetic elements.

8. The apparatus set forth in claim 7 wherein:
  the uniform field is manipulated by introducing a gradient between the surfaces.

9. The apparatus set forth in claim 4 wherein:
  the uniform field is produced in a vessel.

10. The apparatus set forth in claim 9 wherein:
  the uniform field determines behavior of particles in the vessel which are responsive to magnetic fields.

11. The apparatus set forth in claim 10 wherein:
  The uniform field is produced in the neighborhood of a workpiece in the vessel, the workpiece being operated on by the particles.

12. The apparatus set forth in claim 1 wherein:
  the magnetic field is produced in a vessel.

13. The apparatus set forth in claim 12 wherein:
  the magnetic field determines behavior of particles in the vessel which are responsive to magnetic fields.

14. An electromagnet for use in apparatus for generating a resultant magnetic field, the electromagnet being planar and the apparatus including another such electromagnet, the planes of the electromagnets being approximately parallel in the apparatus and
  the electromagnet comprising;
    at least a first electromagnetic element and a second electromagnetic element; and
    a core that connects like poles of the first and second electromagnetic elements,
  the apparatus producing a first magnetic field in the electromagnet by repulsion, the first magnetic field being normal to the electromagnet's plane, and the apparatus producing a second such magnetic field in the other electromagnet, the first and second magnetic fields interacting by repulsion to produce the resultant magnetic field.

15. The electromagnet set forth in claim 14 further comprising:
  one or more additional electromagnetic elements,
  the apparatus manipulating the resultant magnetic field by changing the direction and/or magnitude of the current in the electromagnetic elements.

16. A kit for equipping a reactor with magnetic enhancement, the reactor having a chamber and the kit comprising:
   a pair of electromagnets having the form of a polygon with parallel sides, the interior diameter of the polygon being such that the periphery of the chamber fits within the polygon and each electromagnet including a plurality of windings that are connectible to a power supply; and
   mounts that mount the pair of electromagnets around the periphery of the chamber such that the distance between planes defined by the mounted elements is approximately one half the distance between parallel sides of the polygon.

17. The kit set forth in claim 16 further comprising:
   the power supply.

18. The kit set forth in claim 16 wherein:
   the reactor is of the type that includes a plurality of electromagnets with horizontal and vertical legs mounted on the sides of the chamber and a power supply that provides power to the electromagnets;
   the pair of electromagnets having the form of a polygon are adapted to be used with the power supply; and
   the mounts are adapted to be used with mounting arrangements originally intended for the plurality of electromagnets with horizontal and vertical legs.

* * * * *